United States Patent
Liao et al.

(10) Patent No.: US 10,446,731 B2
(45) Date of Patent: Oct. 15, 2019

(54) LIGHT EMITTING DEVICE

(71) Applicant: TAIWAN GREEN POINT ENTERPRISES CO. LTD., Taichung (TW)

(72) Inventors: Pen-Yi Liao, Taichung (TW); Chia-Tai Chen, Taichung (TW); Wen-Chia Tsai, Taichung (TW); Jing-Yi Yang, Taichung (TW); Ai-Ling Lin, Taichung (TW)

(73) Assignee: Taiwan Green Point Enterprises Co., Ltd., Taichung (TW)

( * ) Notice: Subject to any disclaimer, the term of this patent is extended or adjusted under 35 U.S.C. 154(b) by 0 days.

(21) Appl. No.: 16/182,381

(22) Filed: Nov. 6, 2018

(65) Prior Publication Data
US 2019/0074421 A1 Mar. 7, 2019

Related U.S. Application Data

(63) Continuation of application No. 15/392,860, filed on Dec. 28, 2016, now abandoned.

(30) Foreign Application Priority Data

Dec. 31, 2015 (TW) .............................. 104144659 A

(51) Int. Cl.
H01L 33/64 (2010.01)
H01L 33/62 (2010.01)
H01L 21/48 (2006.01)

(52) U.S. Cl.
CPC ........ *H01L 33/642* (2013.01); *H01L 21/4871* (2013.01); *H01L 33/62* (2013.01);
(Continued)

(58) Field of Classification Search
None
See application file for complete search history.

(56) References Cited

U.S. PATENT DOCUMENTS

| 7,638,474 B1 | 12/2009 | Parrish et al. |
| 8,492,003 B2 | 7/2013 | Wang |
(Continued)

FOREIGN PATENT DOCUMENTS

| KR | 20110035189 A | * | 4/2011 |
| KR | 20110038334 A | * | 4/2011 |
(Continued)

*Primary Examiner* — Telly D Green
(74) *Attorney, Agent, or Firm* — Young Basile Hanlon & MacFarlane, P.C.

(57) ABSTRACT

A light emitting device includes a heat sinking substrate, an electrically insulating layer partially formed on the heat sinking substrate, a circuit pattern layer formed on the electrically insulating layer, a light emitting diode (LED) chip, and an electrically insulating and thermally conductive interlayer. The LED chip is indirectly and non-electrically mounted to the heat sinking substrate. The electrically insulating and thermally conductive interlayer is interposed between the bottom portion of the LED chip and a portion of the heat sinking substrate exposed from the electrically insulating layer. A bottom portion of the LED chip bridges the electrically insulating and thermally conductive interlayer and the circuit pattern layer.

8 Claims, 3 Drawing Sheets

(52) U.S. Cl.
CPC .. *H01L 33/641* (2013.01); *H01L 2224/48091* (2013.01); *H01L 2224/49107* (2013.01); *H01L 2224/73265* (2013.01); *H01L 2933/0075* (2013.01)

(56) References Cited

U.S. PATENT DOCUMENTS

| | | | |
|---|---|---|---|
| 9,241,399 | B2 | 1/2016 | Yoon |
| 9,651,979 | B2 | 5/2017 | Wang |
| 9,698,327 | B2 * | 7/2017 | Ishihara .............. H01L 25/0753 |
| 2011/0133236 | A1 | 6/2011 | Nozaki |
| 2012/0125577 | A1 | 5/2012 | Wang |
| 2015/0155459 | A1 * | 6/2015 | Ishihara .............. H01L 25/0753 |
| | | | 362/294 |
| 2015/0181691 | A1 | 6/2015 | Yoon |
| 2016/0132069 | A1 | 5/2016 | Hunger |

FOREIGN PATENT DOCUMENTS

| | | |
|---|---|---|
| KR | 20130031491 A | 3/2013 |
| KR | 20130141175 A | 12/2013 |
| KR | 20140001548 A | 1/2014 |
| TW | I505765 B | 10/2015 |
| TW | I506830 B | 11/2015 |

\* cited by examiner

LIGHT EMITTING DEVICE

CROSS-REFERENCE TO RELATED APPLICATION

This is a continuous application of U.S. patent application Ser. No. 15/392,860, filed on Dec. 28, 2016, which claims priority of Taiwanese Invention Patent Application No. 104144659, filed on Dec. 31, 2015 and whose disclosure is incorporated herein in its entirety by reference.

FIELD

The disclosure relates to a light emitting device, and more particularly to alight emitting device with a heat sinking substrate, and a method of making the same.

BACKGROUND

Referring to FIG. 1, U.S. Pat. No. 7,683,474 B2 (hereinafter referred to as the '474 patent) discloses a conventional light emitting diode (LED) device 30 that includes a metal heat sinking base 64, a walled container 32 disposed on the metal heat sinking base 64 and defining a surrounded volume, first and second conductors 40, 42 formed on the metal heat sinking base 64 within the surrounded volume of the walled container 32, a first pad 50 formed on the first conductor 40, a second pad 52 formed on the second conductor 42, at least one LED chip 44 disposed on the first pad 50, a wire 48 interconnecting the LED chip 44 and the second pad 52, and an encapsulant 54 filling the surrounded volume of the walled container 32.

The first conductor 40 and the second conductor 42 formed on the metal heat sinking base 64 are respectively electrically connected to the LED chip 44 through the first pad 50 and the second pad 52. Thus, electric power is supplied to the LED chip 44 through the first and second conductors 40, 42, and heat generated by operation of the LED chip 44 is also dissipated by the metal heat sinking base 64 through the first and second conductors 40, 42.

However, an adhesive layer (not shown) is required to be disposed between the first conductor 40 and the metal heat sinking base 64 so as to securely dispose the first conductor 40, which exerts a dual function in electric power transmission and heat dissipation, on the metal heat sinking base 64. Inclusion of the adhesive layer tends to decrease heat dissipating efficiency of the first conductor 40. Besides, due to the dual function of the first conductor 40, the first conductor 40 performs heat dissipation and electric power transmission at the same time, and heat dissipating efficiency of the first conductor 40 is unavoidably decreased and cannot be fully exploited. Therefore, there is plenty of room for improving the heat dissipating efficiency of the LED device.

SUMMARY

Therefore, an object of the disclosure is to provide a light emitting device that can alleviate at least one of the drawbacks of the prior art.

According to the disclosure, a light emitting device includes a heat sinking substrate, an electrically insulating layer, a circuit pattern layer, a light emitting diode (LED) chip, and an electrically insulating and thermally conductive interlayer.

The electrically insulating layer is partially formed on the heat sinking substrate so as to expose a portion of the heat sinking substrate.

The circuit pattern layer is formed on the electrically insulating layer.

The LED chip is indirectly and non-electrically mounted to the portion of the heat sinking substrate exposed from the electrically insulating layer and the circuit pattern layer, and includes a bottom portion in direct contact with and electrically connected to the circuit pattern layer and a top portion opposite to the bottom portion.

The electrically insulating and thermally conductive interlayer is interposed between the bottom portion of the LED chip and the portion of the heat sinking substrate exposed from the electrically insulating layer.

The bottom portion of the LED chip bridges the electrically insulating and thermally conductive interlayer and the circuit pattern layer.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
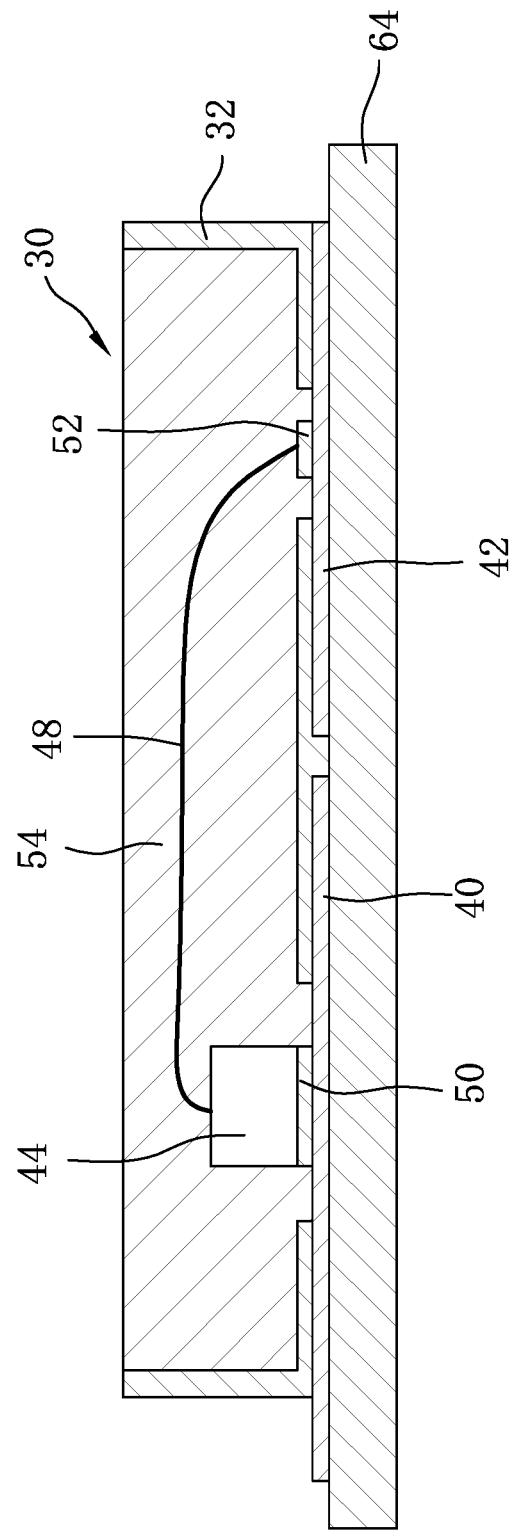
FIG. 1 is a schematic cross sectional view illustrating a conventional light emitting diode device of U.S. Pat. No. 7,683,474 B2.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIG. 1, an embodiment of a light emitting device according to the disclosure includes a heat sinking substrate 2, an electrically insulating layer 3, a circuit pattern layer 4, and at least one light emitting diode (LED) chip 6.

In the embodiment, the heat sinking substrate 2 has a top surface 22 and a bottom surface 23 opposite to the top surface 22 and is made from a metallic material, such as aluminum alloys and copper alloy, etc. The heat sinking substrate 2 is formed with a plurality of heat sinking fins 21, such as aluminum extruded fins, extending from the bottom surface 23 for being in contact with an atmosphere or an external fluid. The heat sinking substrate 2 may be selected from, but not limited to, other conventional types of heat sinks or combinations thereof. In one form, the top and bottom surfaces 22, 23 of the heat sinking substrate 2 may be coated with a protecting paint layer, a weatherproof paint layer, an electrically insulating paint layer, etc. The heat sinking fins 21 are not coated with the protecting paint layer. It should be noted that the heat sinking substrate 2 may have, but not limited to, a curved configuration that is applicable to a curved contour of a target object, such as a vehicle headlight. In one form, the top surface 22 may have a curved surface in contact with an inner curved surface of a car headlight (not shown). In other words, the top surface 22 of the heat sinking substrate 2, unlike the fins 21, is a curved surface. The configuration of the heat sinking substrate 22 of the disclosure may be modified based on actual applications.

The electrically insulating layer 3 is partially formed on the top surface 22 of the heat sinking substrate 2 so as to expose a portion of the top surface 22 of the heat sinking substrate 2. The electrically insulating layer 3 is made from an electrically insulating material that maybe selected from epoxy resin, acrylic resin, and so on. The electrically insulating layer 3 is desired to have a thickness as thin as possible to reduce the effect of heat conduction while maintaining electric insulativity. Preferably, the thickness ranges between 20 μm and 40 μm.

The circuit pattern layer 4 is formed on the electrically insulating layer 3 and has a predetermined pattern that is based on an equivalent circuit design of the light emitting device. In one form, the circuit pattern layer 4 includes an active layer 41 which may include a polymer, a catalytic metal, or a combination thereof and which is formed on the electrically insulating layer 3, and a first electroless-plated metal layer 42 which is formed on the active layer 41. In this embodiment, the circuit pattern layer 4 is exemplified to further include, but not limited to, a second electroless-plated metal layer 42'. In other words, the circuit pattern layer 4 may include the first electroless-plated metal layer 42 interposed between the active layer 41 and the second electroless-plated metal layer 42'.

The catalytic metal of the active layer 41 may be selected from the group consisting of palladium (PD), rhodium (Rh), osmium (Os), iridium (Ir), platinum (Pt), gold (Au), silver (Ag), copper (Cu), nickel (Ni), iron (Fe) and alloys thereof. The first electroless-plated metal layer 42 may be made from a metal material selected from the group consisting of copper (Cu), nickel (Ni) and alloys thereof. The second electroless-plated metal layer 42' may be made from a metal material selected from the group consisting of platinum (Pt), silver (Ag), tin (Sn), gold (Au), palladium (Pd) and alloys thereof, and is used for protecting the first electroless-plated metal layer 42 from oxidation. The second electroless-plated metal layer 42' can serve as an electrode for external electrical connection.

The LED chip 6 is electrically connected to the circuit pattern layer 4 and indirectly and non-electrically mounted to the portion of the heat sinking substrate 2 exposed from the electrically insulating layer 3 and the circuit pattern layer 4. In the embodiment, the LED chip 6 is electrically connected to the circuit pattern layer 4 in a wire-bonding manner.

In the embodiment, the light emitting device further includes an electrically insulating and thermally conductive interlayer 5 interposed between the LED chip 6 and the portion of the heat sinking substrate 2 exposed from the electrically insulating layer 3 and the circuit pattern layer 4. The interlayer 5 is made from a thermal interface material (TIM). In one form, the interlayer 5 may be selected from one of thermal grease, a thermal pad, a thermal adhesive, and so on. Therefore, during the operation of the light emitting device, heat generated by the LED chip 6 can be dissipated to the heat sinking substrate 2 through the interlayer 5. In the embodiment, a number of the LED chip is not limited to one.

More specifically, the circuit pattern layer 4 is configured to have a plurality of spaced apart triple-stacked portions, i.e., each of the spaced apart triple-stacked portions has a structure of the first electroless-plated metal layer 42 interposed between the active layer 41 and the second electroless-plated metal layer 42'. The LED chip 6 includes a bottom portion 61, a top portion 62 opposite to the bottom portion 61, and two wires 63 that respectively extend from the top portion 62 and are electrically connected to two corresponding ones of the spaced apart triple-stacked portions of the circuit pattern layer 4 through wire bonding. The two corresponding triple-stacked portions of the circuit pattern layer 4 are adapted to respectively serve as a positive electrode and a negative electrode. Since the configuration and the material of the LED chip 6 are not the essential features of the disclosure and are known to those skilled in the art, further details thereof are not provided herein for the sake of brevity.

Figure 3:
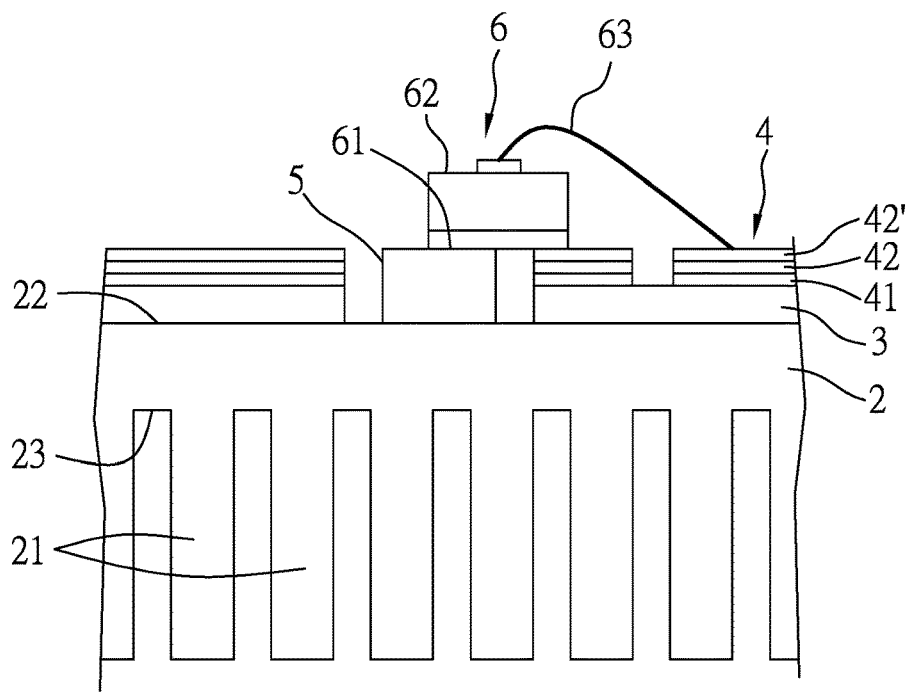
FIG. 3 is a fragmentary schematic view illustrating another configuration of the embodiment.

Referring to FIG. 3, in another configuration of the light emitting device, the LED chip 6 is a vertical-type LED, and the bottom portion 61 serves as an electrode. The LED chip 6 includes a wire 63 interconnecting the top portion 62 and a corresponding one of the spaced apart triple-stacked portions of the circuit pattern layer 4. In other words, the top portion 62 is electrically connected to the circuit pattern layer 4 in wire-bonding manner. The bottom portion 61 of the LED chip 6 bridges the electrically insulating and thermally conductive interlayer 5 and a corresponding one of the spaced apart triple-stacked portions of the circuit pattern layer 4 adjacent to the interlayer 5.

Figure 2:
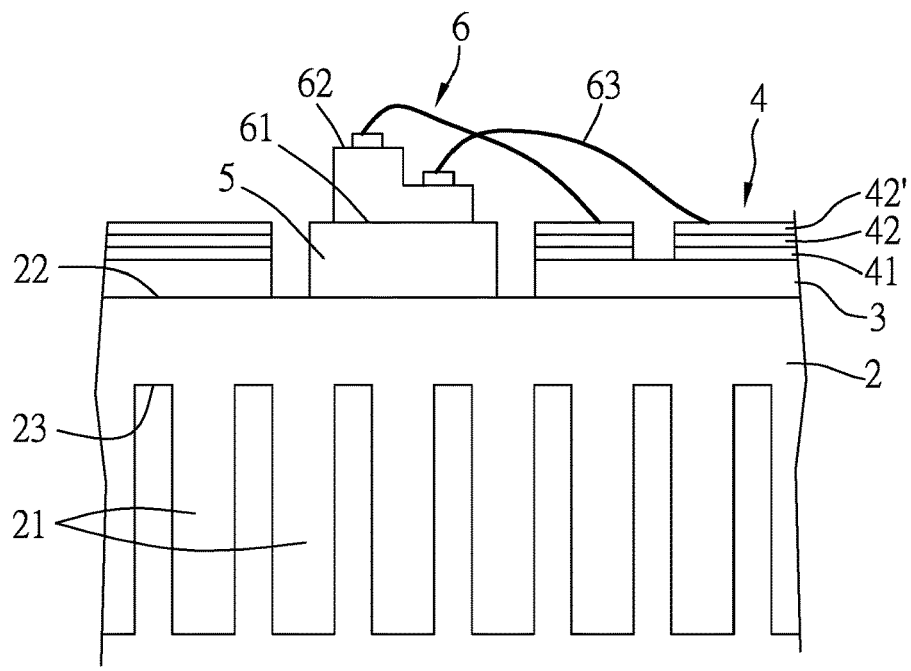
FIG. 2 is a fragmentary schematic view illustrating an embodiment of a light emitting device according to the disclosure.

By virtue of the structural design of the light emitting device of the disclosure shown in FIGS. 2 and 3, heat dissipation and electric power transmission of the light emitting device are carried out through different paths. The heat dissipation path of the light emitting device is from the LED chip 6 or the circuit pattern layer 4 to the heat sinking substrate 2 through the electrically insulating layer 3, while the electric power transmission path is from the LED chip 6 to the circuit pattern layer 4. Therefore, the resistivity of the circuit pattern layer 4 will not be undesirably increased due to heat accumulated therein.

Figure 4:
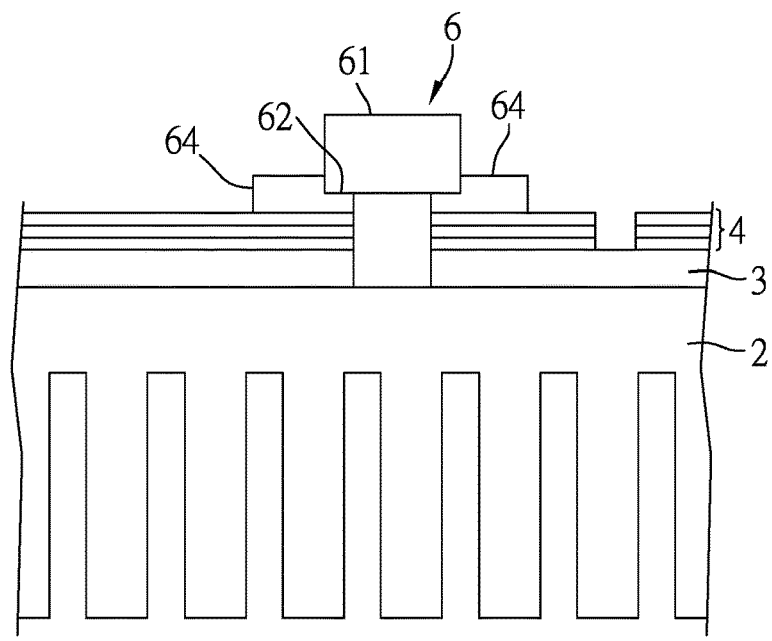
FIG. 4 is a fragmentary schematic view illustrating a modification of the embodiment.

Referring to FIG. 4, in another configuration of the light emitting device, the light emitting device further includes at least one solder pad 64 that is formed on the circuit pattern layer 4. In this implementation, there are two solder pads 64 formed on the circuit pattern layer 4. The LED chip 6 is electrically connected to the circuit pattern layer 4 in a flip-chip manner. More specifically, the top portion 62 of the LED chip 6 is electrically connected to the circuit pattern layer 4 through two solder pads 64.

Figure 5:
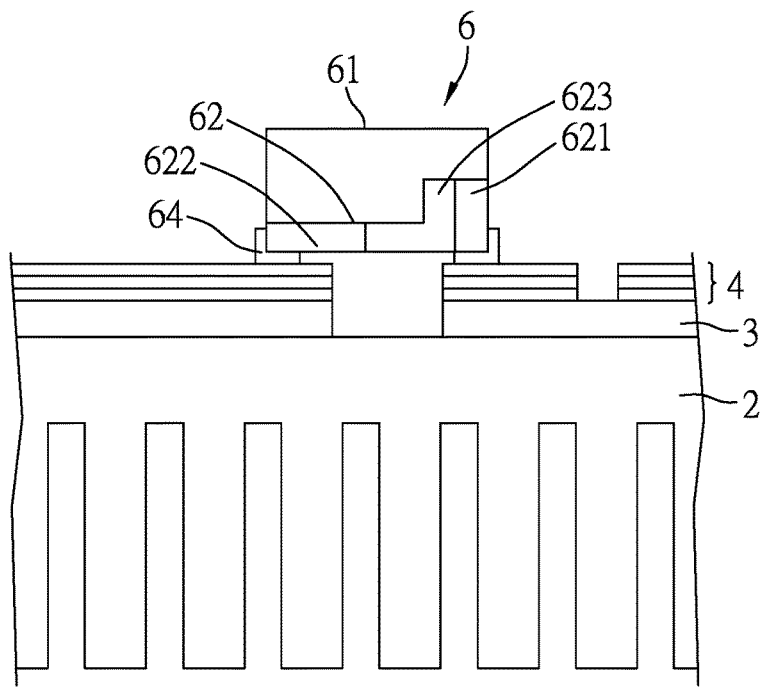
FIG. 5 is a fragmentary schematic view illustrating another modification of the embodiment.

Referring to FIG. 5, in the other configuration of the light emitting device, the light emitting device further includes at least one solder pad 64 that is formed on the circuit pattern layer 4. The LED chip 6 is electrically connected to the circuit pattern layer 4 in a flip-chip manner. The top portion 62 of the LED chip 6 includes a first electrode 621, a second electrode 622 that is spaced apart from the first electrode 622, and an insulator 623 that is disposed between the first electrode 621 and the second electrode 622. The first and second electrodes 621, 622 are respectively connected to the circuit pattern layer 4 through a respective one of the solder pads 64.

In this implementation, heat generated by the LED chip 6 can also be efficiently dissipated by the heat sinking substrate 2 through the electrically insulating layer 3.

Referring back to FIGS. 2 and 3, a method of making the embodiment of the light emitting device includes the following steps.

First, the electrically insulating layer 3 is partially formed on the heat sinking substrate 2 so as to expose a portion of the heat sinking substrate 2. In the method, the heat sinking substrate 2 is formed with a plurality of heat sink fins 21. The electrically insulating layer 3 is made of, but not limited to, epoxy, and is manufactured using electro-deposition (ED) coating techniques. It is noted that the portion of the heat sinking substrate 2 formed with the electrically insulating layer 3 is a position for the LED chip 6 to be formed on.

Then, the circuit pattern layer 4 is formed on the electrically insulating layer 3. More specifically, the circuit pattern layer 4 is formed by forming the active layer 41, after which the first electroless-plated metal layer 42 is formed on the active layer 41. In the method, the second electroless plating metal layer 42' is further formed on the first electroless-plated metal layer 42.

More specifically, the active layer 41 is first formed on the electrically insulating layer 3 using screen printing techniques.

It should be noted that the electrically insulating layer 3 and the active layer 41 may be also respectively formed using digitech printing techniques, spraying techniques, transfer printing techniques, dip plating techniques, or powder coating techniques.

Thereafter, the heat sinking substrate 2 cooperated with the electrically insulating layer 3 and the active layer 41 are dipped in a chemical plating bath containing metal ions, in which the metal ions are reduced so as to form a metal nucleus on the active layer 41 and in which the metal nucleus serves as a catalytic layer so as to conduct the reduction reaction thereon. Therefore, the first electroless-plated metal layer 42 is thus deposited on the active layer 41 for a predetermined time and includes a predetermined pattern corresponding in position to the active layer 41. In addition, the second electroless-plated metal layer 42' may be deposited on the first electroless-plated metal layer 42 using the same chemical plating techniques that are used in the deposition of the first electroless-plated metal layer 42.

In the embodiment, the chemical plating bath used in the deposition of the first electroless-plated metal layer 42 is a chemical plating solution containing copper sulfate, such that the first electroless-plated metal layer 42 thus deposited is made of copper. The chemical plating bath used in the deposition of the second electroless-plated metal layer 42' is a chemical plating solution containing silver nitrate, such that the second electroless-plated metal layer 42' thus deposited is made of silver. Since the chemical plating techniques are well known to those skilled in the art, further details thereof are not provided herein for the sake of brevity. Furthermore, the first and second electroless-plated metal layers 42, 42' may be deposited using sputtering techniques, another dip plating technique different from the electroless plating techniques, or evaporation techniques.

It is noted that the formation of the circuit pattern layer 4 may be conducted by one of two processes. One of the processes includes: forming the active layer 4 with a predetermined pattern on the electrically insulating layer 3; and forming on the patterned active layer 41 the first electroless-plated metal layer 42 that has a pattern corresponding in position to the pattern of the active layer 41 so as to cooperate with the pattern of the active layer 41 to form the circuit pattern layer 4. The other one of the processes includes: forming an active layer on the electrically insulating layer 3; forming the electroless-plated metal layer on a non-patterned active layer; and removing a portion of the electroless-plated metal layer and a portion of the active layer from a top surface of the electroless-plated metal layer to the active layer using laser techniques or other suitable techniques, so that the heat sinking substrate 2 corresponding in position to the etched portion of the electroless-plated metal layer and the active layer is exposed and the circuit pattern layer 4 is thus formed.

Subsequently, the electrically insulating and thermally conductive interlayer 5 is formed on the top surface 22 of the heat sinking substrate 2 that is exposed from the circuit pattern layer 4.

The LED chip 6 is electrically connected to the circuit pattern layer 4 and is indirectly and non-electrically mounted to the portion of the heat sinking substrate 2 that is exposed from the electrically insulating layer 3 and the circuit pattern layer 4. More specifically, the LED chip 6 is mounted to the heat sinking substrate 2 through the interlayer 5. In other words, the interlayer 5 is interposed between the portion of the heat sinking substrate 2 and the LED chip 6.

The LED chip 6 is connected to the circuit pattern layer 4 by a wire bonding process. Since the wire bonding process is well known to those skilled in the art, further details thereof are not provided herein for the sake of brevity.

Referring back to FIGS. 4 and 5, the formation of the interlayer 5 may be alternatively omitted in a method of making another configuration of the light emitting device, and the LED chip 6 is electrically connected to the circuit pattern layer 4 in the flip-chip manner.

More specifically, two solder pads 64 are formed on the circuit pattern layer 4, and then the LED chip 6 is electrically connected to the circuit pattern layer 4 through the solder pads 64 by a flip-chip mounting process. Since the flip-chip mounting bonding process is well known to those skilled in the art, further details thereof are not provided herein for the sake of brevity.

In summary, by virtue of the inclusion of the heat sinking substrate 2, the heat can be effectively conducted and dissipated away from the LED chip 6. Furthermore, by virtue of the interlayer 5 cooperated with the heat sinking substrate 2, a heat dissipation path different from the electric conduction path is provided. Hence, stability, luminous efficiency and lifetime of the light emitting device can be improved. Additionally, the method of making the light emitting device is relatively uncomplicated.

In the description above, for the purposes of explanation, numerous specific details have been set forth in order to provide a thorough understanding of the embodiment. It will be apparent, however, to one skilled in the art, that one or more other embodiments maybe practiced without some of these specific details. It should also be appreciated that reference throughout this specification to "one embodiment," "an embodiment," an embodiment with an indication of an ordinal number and so forth means that a particular feature, structure, or characteristic maybe included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A light emitting device, comprising:
   a heat sinking substrate;

an electrically insulating layer partially formed on said heat sinking substrate so as to expose a portion of said heat sinking substrate;

a circuit pattern layer formed on said electrically insulating layer;

a light emitting diode (LED) chip being indirectly and non-electrically mounted to said portion of said heat sinking substrate exposed from said electrically insulating layer and said circuit pattern layer, and including a bottom portion that is an electrode in direct contact with and electrically connected to said circuit pattern layer and a top portion opposite to said bottom portion; and an electrically insulating and thermally conductive interlayer being interposed between said bottom portion of said LED chip and said portion of said heat sinking substrate exposed from said electrically insulating layer, and being in direct contact with said bottom portion of said LED chip, and being spaced apart from said electrically insulating layer and said circuit pattern layer, wherein said bottom portion of said LED chip bridges said electrically insulating and thermally conductive interlayer and said circuit pattern layer.

2. The light emitting device of claim 1, wherein said LED chip is a vertical-type chip.

3. The light emitting device of claim 1, wherein said electrically insulating and thermally conductive interlayer is made from a thermal interface material (TIM).

4. The light emitting device of claim 3, wherein said TIM is selected from one of thermal grease, a thermal pad, and a thermal adhesive.

5. The light emitting device of claim 1, wherein said circuit pattern layer includes an active layer formed on said electrically insulating layer and including a catalytic metal material and a first electroless-plated metal layer formed on said active layer.

6. The light emitting device of claim 5, wherein said circuit pattern layer further includes a second electroless-plated metal layer formed on said first electroless-plated metal layer, which is made from a metal material selected from the group consisting of platinum (Pt), silver (Ag), tin (Sn), gold (Au), rhodium (Rh), palladium (Pd), and alloys thereof.

7. The light emitting device of claim 6, wherein said circuit pattern layer has a plurality of spaced-apart triple-stacked portions, said bottom portion of said LED chip bridging said electrically insulating and thermally conductive interlayer and one of said spaced-apart triple-stacked portions of said circuit pattern layer adjacent to said electrically insulating and thermally conductive interlayer.

8. The light emitting device of claim 1, wherein said heat sinking substrate is formed with a plurality of heat sinking fins opposite to said electrically insulating layer and said LED chip.

* * * * *